(12) United States Patent
Chen et al.

(10) Patent No.: US 7,190,047 B2
(45) Date of Patent: Mar. 13, 2007

(54) TRANSISTORS AND METHODS FOR MAKING THE SAME

(75) Inventors: Young-Kai Chen, Berkeley Heights, NJ (US); Vincent Etienne Houtsma, Berkeley Heights, NJ (US); Nils Guenter Weimann, Gillette, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/859,894

(22) Filed: Jun. 3, 2004

(65) Prior Publication Data

US 2005/0269594 A1    Dec. 8, 2005

(51) Int. Cl.
*H01L 27/082* (2006.01)
(52) U.S. Cl. ............... 257/586; 257/615; 257/E29.033; 257/E29.188; 438/312; 438/320
(58) Field of Classification Search ............... 438/312, 438/320, 348; 257/E29.033, E29.188, 586, 257/615
See application file for complete search history.

(56) References Cited

U.S. PATENT DOCUMENTS

| | | | | |
|---|---|---|---|---|
| 5,166,081 A | * | 11/1992 | Inada et al. ................. | 438/321 |
| 6,225,241 B1 | * | 5/2001 | Miyoshi ..................... | 438/794 |
| 6,310,368 B1 | * | 10/2001 | Yagura ........................ | 257/197 |
| 6,486,532 B1 | * | 11/2002 | Racanelli ..................... | 257/571 |
| 2004/0046182 A1 | * | 3/2004 | Chen et al. ................. | 257/197 |
| 2005/0032323 A1 | | 2/2005 | Chen et al. ................. | 438/369 |

OTHER PUBLICATIONS

Oka et al., Small-Scaled InGaP/GaAs HBT's with WSi/Ti Base Electrode and Buried $SiO_2$, IEEE Transactions On Electron Devices, vol. 45, No. 11, pp. 2276-2282 (Nov. 1998).
U.S. Appl. No. 10/243,369, filed Sep. 13, 2002, Chen et al.
U.S. Appl. No. 10/430,499, filed May 6, 2003, Chua.

* cited by examiner

*Primary Examiner*—Trung Dang (57) ABSTRACT

Apparatus comprising: a first compound semiconductor composition layer doped to have a first charge carrier polarity; a second compound semiconductor composition layer doped to have a second charge carrier polarity and located on the first layer; a third compound semiconductor composition layer doped to have the first charge carrier polarity and located on the second layer; a base electrode on the second layer; and a spacer ring interposed between and defining a charge carrier access path distance between the base electrode and the third layer, the path distance being within a range of between about 200 Å and about 1000 Å. Techniques for making apparatus. Apparatus is useful as a heterobipolar transistor, particularly for high frequency applications.

19 Claims, 5 Drawing Sheets

TRANSISTORS AND METHODS FOR MAKING THE SAME

The U.S. Government has a paid-up license in this invention and the right in limited circumstances to require the patent owner to license others on reasonable terms as provided for by the terms of U.S. Defense Advanced Research Projects Agency ("DARPA") TFAST contract No. MDA972-03-C-0027.

FIELD OF THE INVENTION

This invention relates to the fields of transistors, methods of making transistors, and integrated circuits comprising transistors.

BACKGROUND OF THE INVENTION

Transistors in vast quantities linked into massive integrated circuits form the backbones of microprocessors and other high speed active electronic devices. As the maximum available processing speeds of such devices continually grow, the demand for transistors facilitating still greater processing speeds likewise grows unabated. A fundamental strategy for delivering such ever increasing speed involves progressively scaling down the transistor dimensions.

Heterobipolar transistors ("HBTs") are one common type of transistors. HBTs are fabricated from P and N type doped semiconductor materials. N type doped semiconductor materials comprise excess free electrons, and P type doped semiconductor materials comprise excess free holes. N type doped semiconductor materials can conduct an electrical current by the transfer of free electrons, as they are doped with donors of negative charge carriers. P type doped semiconductor materials can conduct an electrical current by the transfer of free holes, as they are doped with negative charge acceptors.

In one type of HBT, referred to as an NPN transistor, the basic active structure comprises two layers of an N type doped semiconductor with a layer of a P type doped semiconductor sandwiched in between. The middle layer receives an input signal to be amplified or switched, and is referred to as the base. One of the two outside layers receives an electrical power input to the HBT and is referred to as the emitter. The other of the two outside layers provides an electrical power output from the transistor and is referred to as the collector. The voltage of the base must be more positive than that of the emitter, and the voltage of the collector must be more positive than that of the base. Modulation of an electrical signal that is input to the base controls the output signal to the collector. A small current that is input to the base can control a much larger current flowing from the emitter to the collector.

In another type of HBT, referred to as a PNP transistor, the basic active structure comprises two layers of a P type doped semiconductor with a layer of an N type doped semiconductor sandwiched in between. The middle layer again receives an input signal to be amplified or switched, and is referred to as the base. One of the two outside layers receives an electrical power input to the HBT and is referred to as the emitter. The other of the two outside layers provides an electrical power output from the transistor and is referred to as the collector. The voltage of the base must be more positive than that of the collector, and the voltage of the emitter must be more positive than that of the base. Modulation of an electrical signal that is input to the base controls the output signal to the collector.

A negative current flows from the emitter to the collector in an NPN transistor, whereas a positive current flows from the emitter to the collector in a PNP transistor. Electrons typically travel more rapidly than holes. Accordingly, NPN transistors are generally preferred, particular in applications for carrying signals at frequencies in excess of 1 gigahertz ("Ghz"). However, PNP transistors, and combinations of PNP and NPN transistors, can also be used in various end use applications.

HBT structures include one or more heterojunctions. A heterojunction is defined as an interface between two semiconductor materials having different compositions. In addition or alternatively, the two materials may be of different conduction types, that is, N or P type conductors. Common types of heterojunctions for HBTs include AlGaAs/GaAs, InGaP/GaAs, InP/InGaAs, and InGaAlAs/InGaAs, where the "/" indicates an interface. The heterojunction leads to the formation of a potential barrier in either the conduction band or the valence band, blocking the flow of one type of carrier while allowing the flow of carriers having the opposite charge. For example, in an N—InP/P—InGaAs emitter-base HBT junction, electrons are permitted to flow from the emitter into the base in forward bias, while holes are blocked from entering the emitter from the base. This heterojunction design typically results in a high injection efficiency of electrons over holes, and in higher device speed as compared to a classic bipolar transistor, since electrons move much faster than holes in this material system.

Electrodes are separately placed in contact with each of the three semiconductor layers in the HBT devices. Hence, a portion of the base semiconductor layer is exposed so that a base electrode can be applied to that layer. Although the three semiconductor layers are sandwiched in mutual contact, the three electrodes need to be mutually isolated to prevent shorting of the HBT. Hence, for example, a suitable distance between the base electrode and the emitter layer is maintained. In a typical conventional HBT transistor, the minimum allowable distance between the base electrode and the emitter layer is about 2000 Angstroms (Å). The base access resistance is given by the product of base sheet resistance and the separation described above. The sheet resistance of the base layer is typically within a range between about 200 Ohms ($\Omega$) per square (sq) and about 1000 $\Omega$/sq.

Efforts to scale down the size of HBT transistors desirably involve reducing the thicknesses of the semiconductor layers as well as the length and width dimensions of features in such layers. Such size reductions reduce the distances separating the electrodes and semiconductor layers for the emitter, collector and base, thereby increasing the potential for electrical shorting. Hence, for example, transistor designs have typically required the maintenance of a defined distance between the base electrode and the emitter layer.

There is a continuing need for HBTs characterized by high speed and small dimensions that are not typically subject to shorting, and for integrated circuits comprising such HBTs. There further is a need for suitable processes of making such HBTs.

SUMMARY OF THE INVENTION

The present invention provides heterobipolar transistors comprising multilayer structures each including a collector, a base and an emitter, and further comprising a base electrode located at a controlled charge carrier access path distance from the emitter. This controlled access path distance facilitates a reduced base access resistance, resulting in improved transistor performance. A spacer ring positioned around a side surface of the emitter controls subsequent positioning of the base electrode, and can remain in place to function as an insulator during operation of the transistor. Processes for fabricating such transistors are also provided.

In one embodiment, the present invention provides an apparatus comprising: a first compound semiconductor composition layer doped to have a first charge carrier polarity; a second compound semiconductor composition layer doped to have a second charge carrier polarity and located on said first layer; a third compound semiconductor composition layer doped to have said first charge carrier polarity and located on said second layer; a base electrode on said second layer; and a spacer ring interposed between and defining a charge carrier access path distance between said base electrode and said third layer, said path distance being within a range of between about 200 Å and about 1000 Å.

In another embodiment, the present invention provides a method for fabricating a heterobipolar transistor, comprising the steps of: providing a multilayer structure comprising a first compound semiconductor composition layer doped to have a first charge carrier polarity, a second compound semiconductor composition layer doped to have a second charge carrier polarity and forming a first junction with said first layer, and a third compound semiconductor composition layer doped to have said first charge carrier polarity and forming a second junction with said second layer; dry etching a first portion of said third layer to yield a compound semiconductor substructure, a second portion of said third layer forming a first surface of preselected horizontal dimensions and being protected from said dry etching; surrounding said first surface of said compound semiconductor substructure with a spacer ring having a second surface of preselected horizontal dimensions; forming a base electrode precursor on said second layer and in contact with said second surface; and etching said base electrode precursor with a dry etchant to yield a base electrode.

A more complete understanding of the present invention, as well as further features and advantages of the invention, will be apparent from the following Detailed Description and the accompanying drawings.

DETAILED DESCRIPTION

The present invention will now be described more fully with reference to the accompanying drawings, in which several presently preferred embodiments of the invention are shown. This invention may, however, be embodied in various forms and should not be construed as being limited to the embodiments set forth herein.

The present invention provides HBTs comprising base electrodes separated by defined vertical and horizontal distances from an adjacent emitter or collector. A space that directly spans such distances may be occupied by ambient air or by another dielectric material. The present invention further provides processes for making such HBTs, comprising the formation of a spacer ring that facilitates accurate self aligned preparation of the base electrodes.

Figure 1:
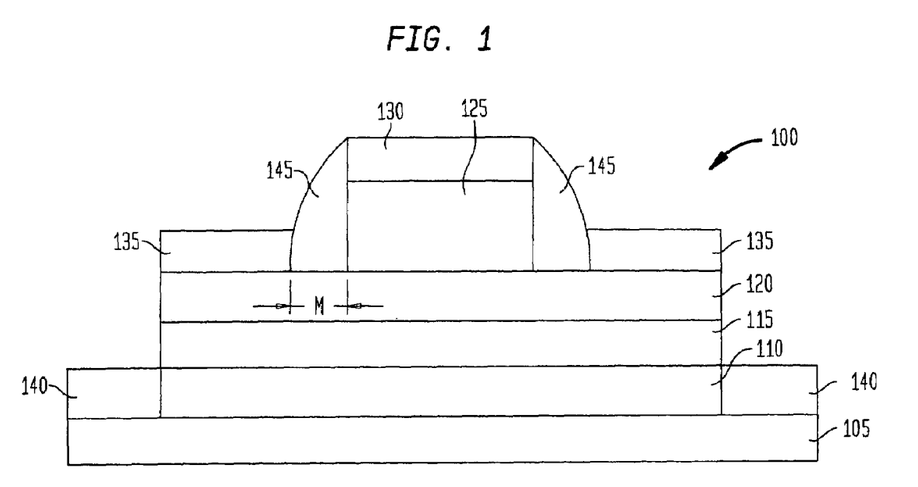
FIG. 1 shows a cross section of a heterobipolar transistor according to the invention.

FIG. 1 shows a cross section of an HBT 100 in accordance with the present invention. The HBT 100 comprises a multilayer structure comprising a substrate 105, a subcollector 110, a collector 115, a base 120, and an emitter 125. The HBT 100 further comprises an emitter electrode 130, a base electrode 135, and a collector electrode 140. Further, the HBT 100 comprises a spacer ring 145, which separates the base electrode 135 from the emitter 125 and from the emitter electrode 130. In one embodiment, the substrate 105, subcollector 110, collector 115, base 120, and emitter 125 form a sandwich of layers placed on each other in the listed order, with the substrate 105 on the bottom. The term "on" in this context means that at least a portion of a first layer overlies and is in direct contact with at least a portion of an underlying second layer. In another embodiment, not shown, the substrate 105, emitter 125, base 120, collector 115, and subcollector 110 form a sandwich of layers placed on each other in such alternative listed order, with the substrate 105 on the bottom.

The emitter electrode 130 is in direct physical contact with the emitter 125 and is not in such contact with the subcollector 110, the collector 115 or the base 120. The base electrode 135 is in direct physical contact with the base 120 and is not in such contact with the subcollector 110, the collector 115, or the emitter 125. The collector electrode 140 is in direct physical contact with either or both of the subcollector 110 and the collector 115, and is not in such contact with the base 120 or the emitter 125. The emitter electrode 130, the base electrode 135, and the collector electrode 140 are placed in direct electrical communication with an external circuit for operating the HBT 100 by metal traces, not shown. The external circuit may be, for example, an integrated circuit comprising many HBTs 100. Such integrated circuits typically include a collection of active components including transistors, diodes and memory cells for example, metal traces that conduct signals between these components, and insulating material that protects the HBTs from undesired contact and separates the metal traces from each other according to the integrated circuit layout. The external circuit includes metal traces that are intended to carry the signals propagated through the external circuit, and metal traces connecting the HBT 100 to a suitable power source to supply the necessary direct current bias.

The cutoff frequency $f_t$ is an important benchmark for transistor performance. The cutoff frequency is a measure of the maximum speed of a transistor and is defined in cycles per second, or Hertz (Hz). The cutoff frequency $f_t$ is given by the following formula:

$$\frac{1}{2\pi f_T} = \tau_F + \underbrace{C_{BC}(R_{EE} + R_C)}_{\tau_C} + \underbrace{(C_{BE} + C_{BC})r_E}_{\tau_E}$$

In the preceding formula, $\tau_F$ designates the forward transit time, $\tau_E$ designates the emitter charging time, and $\tau_C$ designates the collector charging time. The charging times are related to the parasitic resistances and capacitances $C_{BC}$, $C_{BE}$, $R_{EE}$, $R_C$, and the dynamic resistance $r_E$. The symbols $C_{BC}$, $R_{EE}$, $R_C$ and $C_{BE}$ designate the base-collector capacitance, the terminal resistance on the emitter, the terminal resistance on the collector, and the base-emitter capacitance. The forward transit time describes the time of flight of a carrier through the base and the depleted region of the collector. For example, the forward transit time describes the time of such flight of an electron in the case of an NPN type HBT. At the cutoff frequency $f_t$, the device has unity current gain.

The current gain cutoff frequency presents a fundamental limit to the speed at which a circuit or system comprising these transistors may operate. The value of $f_t$ can be increased by thinning down the collector, emitter and base layers of a transistor, which accordingly are desirable goals in transistor design.

Another important parameter for high speed circuit performance is the maximum frequency of oscillation $F_{max}$ of the transistor, having the following formula:

$$F_{max} = \sqrt{\frac{f_T}{8\pi R_{bb} C_{bc}}}$$

$F_{max}$ is the highest frequency where a power gain can occur in the transistor. In this formula, $f_t$ is the cutoff frequency as explained above, $R_{bb}$ is the base resistance and $C_{bc}$ is the capacitance between the base 120 and the collector 115. Although thinning down the base layer 121 results in an increased $f_t$, the sheet resistance $R_{bb}$ of the base layer 121 will correspondingly increase. This formula shows that as such sheet resistance increases, $F_{max}$ decreases. Accordingly, although scaling down HBT dimensions is desirable, keeping the base layer sheet resistance low is also important. The base access resistance is defined as the lateral base layer sheet resistance on a length path for charge carriers through the portion of the base 120 that is between the emitter 125 and the base electrode 135. Hence, the base access resistance is directly proportional to the access length along the same path. According to the present invention, transistor structures, and processes for making transistors, are provided that reduce the base access resistance by permitting the path length for charge carriers between the base electrode 135 and the emitter 125 to be reduced. The base layer sheet resistance is separately optimized as a tradeoff with the transit time of charge carriers through the vertical thickness of the base 120.

In an integrated circuit, the delay time of a logic gate is directly proportional to the product of the base access resistance and the base collector capacitance, with other factors also affecting such delay time. This delay time is a fundamental indicator of the potential speed of the integrated circuit.

The collector capacitance increases as the collector's thickness decreases. The base access resistance increases as the base layer thickness is decreased, but decreases as the path length m between the base electrode 135 and emitter 125 through the base layer 121 is shortened. The spacer ring 145 facilitates the defined and accurate positioning of the base electrode 135 with respect to the emitter 125, permitting a reduction in the target distance between these elements. Controlling the dimensions of the spacer ring 145 according to the invention permits control of the path length m to a uniformity of at least about 95%. In accordance with the present invention, path lengths m within a range between about 800 Å and about 1000 Å have been obtained. These teachings potentially can also be used to fabricate devices having path lengths m as small as about 200 Å, and even of less than about 200 Å.

Embodiments are provided in which the spacer ring 145 is formed from a highly insulating dielectric composition, which permits a further reduction of such target distance.

In one embodiment, the substrate 105, the subcollector 110, the collector 115, the base 120, the emitter 125, the emitter electrode 130, the base electrode 135, the collector electrode 140 and the spacer ring 145 all have a round shape of which a cross section is shown in FIG. 1. In further embodiments, such shapes are square or rectangular or some other desired shape. The base electrode 135 and the spacer ring 145 may, if desired, not completely encircle the lateral sides of the emitter 125. In operation of the HBT 100, a small current is caused to flow between the emitter 125 and the base 120. Modulation of such small current is used to control the flow of a much larger potential current that can flow between the emitter 125 and the collector 115.

The collector 115, base 120 and emitter 125 are formed of compound semiconductor materials suitable for making the basic active layers of an HBT. For example, collector 115 and emitter 125 can be formed from the same or two different N type doped compound semiconductors and the base 120 can be formed of a P type doped compound semiconductor, collectively forming the active layers of an NPN transistor. For example, compound semiconductors can be formed by combining together at least one element from each of groups II and IV or at least one element from each of groups III and V of the IUPAC convention Periodic Table of the Elements. Such compound semiconductors are advantageous for use in fabricating high speed active devices due to their high electron mobility and wide band gap properties. Alternatively, the collector 115 and emitter 125 can be formed from the same or two different P type doped compound semiconductors and base 120 can be formed of an N type doped compound semiconductor, collectively forming the active layers of a PNP transistor. While the ensuing discussion is directed to NPN transistors, it is understood that PNP transistors can likewise be fabricated and used.

In a first group of embodiments, the collector 115 comprises three layers of compound semiconductor materials each doped with N dopants such as silicon or tin for example, to a concentration within a range between about $2 \times 10^{16}$ molecules/cubic centimeter (mol/cm$^3$) and about $2 \times 10^{17}$ mol/cm$^3$, including a first top indium-gallium-arsenide layer having a thickness within a range between about 0 Å and about 400 Å in contact with the base 120, a second indium-gallium-arsenide-phosphide layer or an indium-aluminum-gallium-arsenide layer having a thickness within a range between about 300 Å and about 900 Å in contact with the first layer, and a third bottom indium-phosphide layer having a thickness within a range between about 800 Å and about 8000 Å in contact with the second layer. In either of the two foregoing embodiments, the composition of the second layer may be graded between that of the first and third layers in a stepped or continuous manner. In a further embodiment, the collector 115 comprises one layer of indium-gallium-arsenide doped with N dopants to a concentration within a range between about $2 \times 10^{16}$ mol/cm$^3$ and about $2 \times 10^{17}$ mol/cm$^3$, having a thickness within a range between about 800 Å and about 8000 Å.

In one embodiment, the base 120 comprises one layer of indium-gallium-arsenide doped with P dopants such as carbon or beryllium for example, to a concentration within a range between about $4 \times 10^{19}$ mol/cm$^3$ and about $8 \times 10^{19}$ mol/cm$^3$, having a thickness within a range between about 300 Å and about 500 Å.

In one embodiment, the emitter 125 comprises two layers of compound semiconductor materials, including a first indium-gallium-arsenide top layer in contact with the emitter electrode 130 having a thickness within a range between about 300 Å and about 3000 Å doped with N dopants to a concentration within a range between about $2\times10^{19}$ mol/cm$^3$ and about $8\times10^{19}$ mol/cm$^3$, and a second indium-phosphide bottom layer having a thickness within a range between about 300 Å and about 1000 Å in contact with the first layer, doped with N dopants to a concentration within a range between about $2\times10^{17}$ mol/cm$^3$ and about $8\times10^{17}$ mol/cm$^3$.

In one embodiment, indium phosphide is used in the N type compound semiconductor for the collector 115, base 120 and emitter 125, and indium-gallium-arsenide or indium-aluminum-arsenide or both are used in the P type compound semiconductors for the collector 115, base 120 and emitter 125. Further suitable inorganic compound semiconductors include, for example, gallium arsenide, gallium nitride, aluminum nitride, indium nitride, gallium antimonide, indium antimonide, aluminum antimonide, aluminum gallium nitride, aluminum gallium arsenide, aluminum gallium antimonide, gallium aluminum antimonide, indium gallium antimonide, gallium arsenic antimonide, indium gallium phosphide, indium arsenic antimonide, indium gallium arsenide phosphide, indium aluminum gallium arsenide, indium aluminum gallium nitride, indium aluminum gallium antimonide, lead sulfide, cadmium selenide, tin sulfide, cadmium sulfide, zinc selenide, bismuth, and selenium. Other compound semiconductors, for example those comprising two or more of the elements appropriately selected from the group consisting of gallium, arsenic, indium, phosphorus, aluminum, nitrogen, antimony, lead, sulfur, cadmium, selenium, tin, zinc, and bismuth; or otherwise comprising Group II and IV or III and V elements, can also be used. The compound semiconductor composition doping may be provided by using the above mentioned and other known dopants. In addition, as discussed earlier, each of the collector 115, the base 120, and the emitter 125 may comprise a plurality of sublayers of varying compositions, thicknesses and doping, in order to vary the overall energy band profile, doping profile, or both.

The subcollector 110 is formed from one or more of the foregoing compound semiconductors having the same charge carrier polarity as does the collector 115, that is, an N- or P type doped compound semiconductor material. The subcollector 110 serves to collect the current flowing between the collector 115 and the collector electrode 140. Accordingly, the subcollector 10 is typically more heavily doped than is the collector 115. In one embodiment, the subcollector 110 comprises two layers of compound semiconductor materials each doped with N dopants to a concentration within a range between about $1\times10^{19}$ mol/cm$^3$ and about $4\times10^{19}$ mol/cm$^3$, including a first indium-gallium-arsenide top layer having a thickness within a range between about 0 Å and about 300 Å in contact with the collector 115, and a second indium-phosphide bottom layer having a thickness within a range between about 800 Å and about 6000 Å in contact with the first layer. In another embodiment, the subcollector 110 comprises one layer of indium-gallium-arsenide doped with N dopants to a concentration within a range between about $1\times10^{19}$ mol/cm$^3$ and about $4\times10^{19}$ mol/cm$^3$, having a thickness within a range between about 800 Å and about 6000 Å. In a further embodiment, the subcollector 110 is omitted and the collector electrode 140 is formed in direct physical contact with the collector 115. The subcollector 110 may also comprise a plurality of sublayers of varying compositions, thicknesses and doping, in order to vary the overall energy band profile, doping profile, or both.

The base electrode 135 is formed from an etchable electrically conductive material that will not unduly migrate through the base 120. In one embodiment, the base electrode 135 comprises a contact layer in direct contact with the base 120, a diffusion blocking layer in direct contact with the contact layer, and a circuit interconnection layer in direct contact with the diffusion blocking layer. The contact layer maximizes electrical conductivity between the base electrode 135 and the base 120. The circuit interconnection layer maximizes electrical conductivity between the base electrode 135 and the external circuit. The diffusion blocking layer controls migration of the circuit interconnection layer into the base 120, particularly during conventional thermal annealing steps in fabrication of the transistor. However, desirably the diffusion blocking layer facilitates controlled migration of the base electrode 135 by several Å into the base 120 in order to improve conductivity between the base 120 and the base electrode 135. The contact layer may, for example, comprise a refractory metal that is substantially nonreactive with Group II, III, IV and V semiconductors, such as titanium, palladium, or an alloy of same. The diffusion blocking layer is desirably formed from a refractory metal or an alloy comprising a refractory metal, which inhibits excessive migration of such layer and of the interconnection layer. The diffusion blocking layer may, for example, be formed from tungsten silicide or titanium tungsten silicide, or elementary tungsten or platinum. Tungsten and platinum inhibit migration. Tungsten silicide may inhibit migration to a greater degree than elemental tungsten. Tungsten is desirable for its conductivity and the feasibility of its vapor deposition and dry etching. Titanium is a diffusion element, which causes the diffusion blocking layer to migrate slightly into the base 120 without creating conductive spikes that contact the collector 115. The circuit interconnection layer may be, for example, aluminum, copper, a noble metal such as gold or palladium, or an alloy of same. Gold is desirably otherwise avoided in the composition for the base electrode 135 as gold may excessively migrate and cause spikes into the collector 115. The emitter electrode 130 and the collector electrode 140 desirably are formed from materials selected for analogous considerations.

In a first group of embodiments, the base electrode 135 comprises three layers of materials, including a first bottom layer comprising titanium or palladium or an alloy of same in contact with the base 120 having a thickness between about 0 Å and about 50 Å, a second layer comprising tungsten in contact with the first layer having a thickness between about 100 Å and about 300 Å, and a third top layer comprising gold in contact with the second layer having a thickness between about 100 Å and about 600 Å. In a second group of embodiments, the base electrode 135 comprises three layers of materials, including a first bottom layer comprising titanium or palladium or an alloy of same in contact with the base 120 having a thickness between about 0 Å and about 50 Å, a second layer comprising tungsten in contact with the first layer having a thickness between about 100 Å and about 300 Å, and a third top layer comprising aluminum in contact with the second layer having a thickness between about 100 Å and about 600 Å.

In one group of embodiments, the collector electrode 140 comprises three layers of materials, including a first bottom layer comprising palladium in contact with the subcollector 110 having a thickness between about 50 Å and about 200 Å, a second layer comprising platinum in contact with the first layer having a thickness between about 300 Å and about 600 Å, and a third top layer comprising gold or aluminum or an alloy of same in contact with the second layer having a thickness between about 200 Å and about 3000 Å. In a second group of embodiments, the collector electrode 140 comprises two layers of materials, including a first bottom layer comprising tungsten silicide in contact with the subcollector 110 having a thickness between about 200 Å and about 3000 Å, and a second top layer comprising gold, aluminum or an alloy of same in contact with the first layer having a thickness between about 200 Å and about 3000 Å.

In a first group of embodiments, the emitter electrode 130 comprises three layers of materials, including a first bottom layer comprising palladium in contact with the emitter 125 having a thickness between about 50 Å and about 200 Å, a second layer comprising platinum in contact with the first layer having a thickness between about 300 Å and about 600 Å, and a third top layer comprising gold, palladium, nickel or aluminum or an alloy of same in contact with the second layer having a thickness between about 200 Å and about 5000 Å. In a second group of embodiments, the emitter electrode 130 comprises two layers of materials, including a first bottom layer comprising tungsten silicide, titanium tungstide or elemental tungsten or platinum in contact with the emitter 125 having a thickness between about 200 Å and about 3000 Å, and a second top layer comprising gold or aluminum or an alloy of same in contact with the first layer having a thickness between about 200 Å and about 3000 Å. The non-noble metals may form oxides on the surface of the emitter electrode 130, providing further resistance to etching.

Further suitable materials for forming the emitter electrode 130, the base electrode 135, and the collector electrode 140 subject to the above considerations include, for example, other metals, heavily doped semiconductors, conductive ceramics, and conductive polymers. Further suitable metals include, for example, silver, gallium, indium, copper, and alloys. Suitable conductive ceramics include indium tin oxide, for example. Suitable conductive polymers include, for example, polyaniline and poly(ethylene dioxythiophene), the latter also known as "PEDOT".

In one embodiment the spacer ring 145 is formed from a highly insulating dielectric composition that can suitably be deposited in such a manner so that the resulting structure generally maintains the shape as shown in FIG. 1. In this embodiment the spacer ring 145 is formed from a solid material capable of withstanding the subsequent application of the base electrode precursor layer 136 to the HBT 100 as further discussed below. Furthermore in this embodiment the highly insulating dielectric composition is suitable for substantially impeding direct current flow between the base electrode 135, and the emitter 125 and emitter electrode 130. In one embodiment, the spacer ring 145 is formed from a composition selected from the group consisting of silicon nitride ($Si_3N_4$), silicon dioxide ($SiO_2$), and silicon oxycarbide (SiCOH). Other insulating compositions that can be deposited in the shape of spacer ring 145, including mixtures of mutually compatible compositions, can also be used. In addition to serving as an electrical insulator to prevent shorting between the base electrode 135, and the emitter 125 and emitter electrode 130, the spacer ring 145 also passivates the exposed lateral surfaces of the emitter 125. Exposed surfaces of compound semiconductor layers in the HBT 100 are desirably passivated to avoid generation of traps and surface reactions leading to device deterioration.

In another embodiment, the spacer ring 145 is formed from a solid material that may or may not be highly insulating, which is capable of withstanding the subsequent application of the base electrode precursor layer 136 to the HBT 100 as further discussed below. After the base electrode 135 is fabricated, the spacer ring 145 can if desired be removed, leaving behind a space occupied by ambient air. The dielectric constant of air is 1, so air is an excellent insulator. The air space between the base electrode 135, and the emitter 125 and emitter electrode 130, then serves as an insulator.

The substrate 105 serves as a structural support for the HBT 100. In one embodiment, the substrate 105 is formed from an insulating material. In this context, "insulating" means that the substrate 105 has a reduced capability to conduct electrons and holes and thus can be described as being a semi insulating material. However, the scope of meaning of "insulating" also includes and extends to a substrate 105 having a minimal capability to conduct electrons and holes that can thus be described as a highly insulating dielectric. Both semi insulating and highly insulating dielectric materials are substantially unable to carry a current of electrons or holes under the normal operating conditions of the device into which the subject materials are incorporated. In another embodiment, the substrate 105 is formed from an electrically conductive material. In this embodiment, the substrate 105 serves as an integral part of the collector electrode 140. In one embodiment, the insulating substrate 105 is a planar wafer. In this context, "planar" means that the wafer is substantially although not perfectly planar. In another embodiment, the substrate 105 is omitted. In one embodiment, the substrate 105 comprises indium phosphide.

Figure 2:
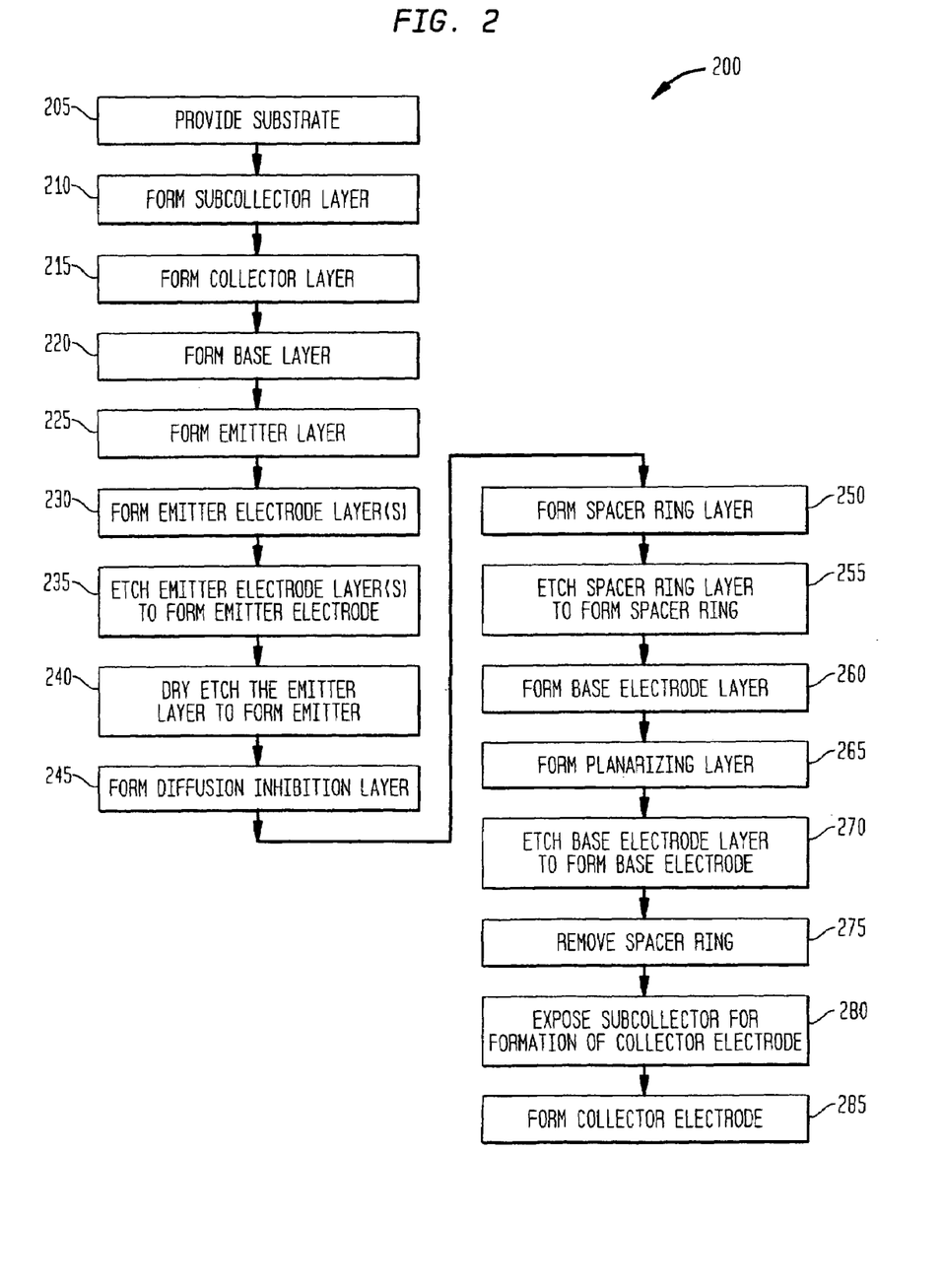
FIG. 2 shows a process for making the heterobipolar transistor of FIG. 1.

FIG. 2 shows an exemplary process 200 for making the HBT 100. FIGS. 3–8 show cross sections of the HBT 100 in various stages of construction by the process 200. FIGS. 3–8, showing the elements of the HBT 100 during its construction, are discussed together with FIG. 2. In one exemplary embodiment, the HBT 100 is an NPN type HBT transistor. Although FIGS. 2–8 will be discussed in connection with fabrication of an NPN type HBT transistor, it is to be understood that PNP type transistors can also be fabricated.

Figure 3:
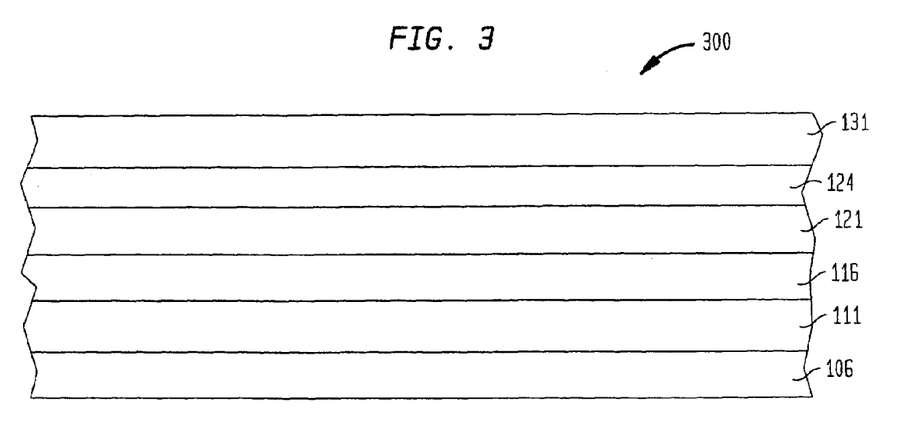
FIGS. 3–8 show the heterobipolar transistor of FIG. 1 in various stages of fabrication according to FIG. 2.

In step 205 a substrate layer 106 is provided as shown in the cross section 300 of the HBT 100 in FIG. 3. Alternatively, if the HBT 100 will be self supporting, then a suitable temporary support is provided on which the subsequent steps in the process 200 are carried out, and step 205 is omitted.

In step 210, a layer of a heavily doped compound semiconductor 111 for forming subcollector 110, as shown in cross section in FIG. 3, is provided on the substrate layer 106 or on the temporary support. The layer of material for forming subcollector layer 111 is an N type doped compound semiconductor. The layer of material for forming subcollector layer 111 desirably has a thickness sufficient to obtain a sheet resistance of less than about 10 Ω/sq. For example, the layer of material for forming subcollector layer 111 can have a thickness within a range between about 1000 Å and about 5000 Å.

The subcollector layer 111 is deposited onto the substrate layer 106 or the temporary support by a suitable chemical vapor deposition (CVD) process or physical vapor deposition (PVD) process such as, for example, low pressure chemical vapor deposition (LPCVD), atmospheric pressure chemical vapor deposition (APCVD), or plasma enhanced chemical vapor deposition (PECVD). LPCVD is preferred, as APCVD can result in poor coating uniformity and purity, and PECVD can result in plasma damage to the substrate 105. Other processes typically used for precision manufacture of active devices such as transistors can also be used. Such processes include, for example, metal organic chemical vapor deposition (MOCVD) and molecular beam epitaxy (MBE). An exemplary type of MBE is metal organic molecular beam epitaxy (MOMBE). In a MOMBE process, for example, the epitaxy gas mixture changes in a stepped or smoothly graduated manner to sequentially produce various doped compound semiconductor layers to be included in the active device. MOCVD or MOMBE are typically the processes of choice for active device fabrication. FIGS. 2–8 will be discussed in connection with use of an exemplary MOMBE process.

In step 215, a layer of N type doped compound semiconductor 116 for forming the collector layer 115, as shown in cross section in FIG. 3, is deposited on the layer of material 111 for forming subcollector 110. The dopant concentration in the layer of material 116 for forming collector layer 115 typically is smaller than that in the layer of material 111 for forming the subcollector 110. The layer of material 116 for forming the collector 115 can have a thickness, for example, within a range between about 1000 Å and about 2000 Å.

In step 220, a layer of P type compound semiconductor 121 for forming the base 120 as shown in cross section in FIG. 3, is deposited on and forms a first junction with the collector layer 116. The base layer 121 can have a thickness, for example, within a range between about 200 Å and about 500 Å. In another embodiment, the base layer 121 has a thickness, for example, within a range between about 300 Å and about 400 Å. In general, the base layer 121 has a lesser thickness than does the collector layer 116 or than does the emitter layer 124.

In step 225, a layer of an N type compound semiconductor 124 for forming the emitter 125 as shown in cross section in FIG. 3, is deposited on and forms a second junction with the base layer 121. The emitter layer 124 can have a thickness, for example, within a range between about 1000 Å and about 2000 Å.

In step 230, an emitter electrode precursor layer or layers 131 as shown in cross section in FIG. 3, are deposited on and form a third junction with the emitter layer 124. Such layer or layers can be applied, for example, by electroplating, evaporation such as electron beam evaporation, casting, electroless deposition, metal chemical vapor deposition, or sputtering.

Figure 4:
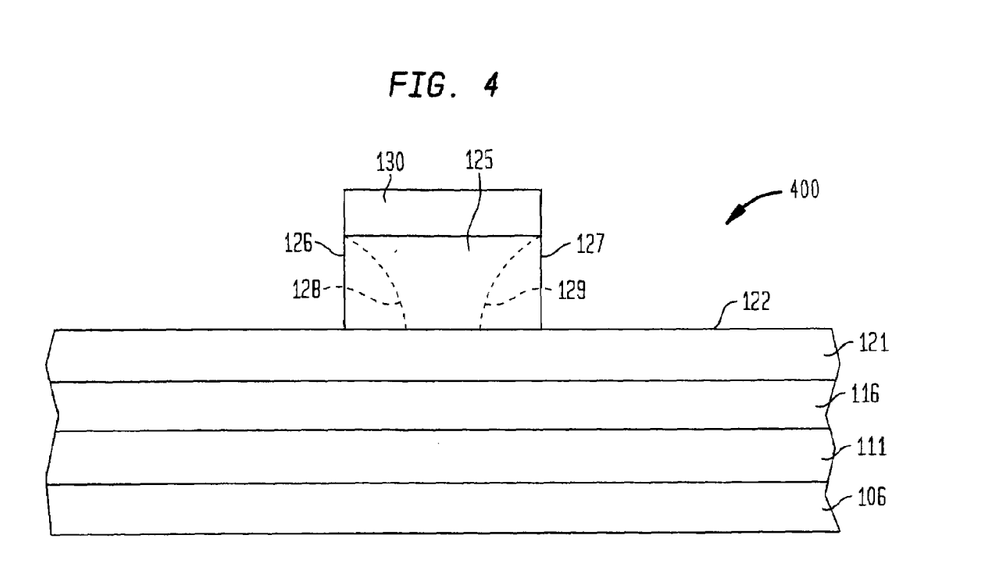

In step 235, the emitter electrode precursor layer or layers 131 are selectively etched by a dry etching process as shown in the cross section 400 of HBT 100 in FIG. 4 to form the emitter electrode 130 also shown in cross section in FIG. 1. Before this etching is carried out, the portion of the top of such emitter electrode precursor layer or layers 131 that is intended to become the emitter electrode 130 is protected from the etchant. It is desirable for such portion of the top of such emitter electrode precursor layer or layers 131 to have a hardness and sufficient thickness to withstand the dry etchant. In particular, it is desirable for such portion to be fabricated from a metal composition that is resistant to deterioration by the sputtering that occurs during dry etching. In one embodiment, such portion of such emitter electrode precursor layer or layers 131 is at least about 50 Å thick. In another embodiment, such portion of such emitter electrode precursor layer or layers 131 has a thickness within a range of between about 100 Å and about 600 Å. Such protection can, for example, take the form of a patterned photoresist or a layer of an oxide, nitride or silicide, by which only the region intended to become the emitter electrode 130 is made resistant to the etchant. A dry etchant is then selected that is suitable for dissolving the unprotected portions of the emitter electrode precursor layer or layers 131, but which leaves the underlying emitter layer 124 substantially intact. For example, low molecular weight fluorocarbons such as carbon tetrafluoride ($CF_4$), trifluoromethane ($CHF_3$), hexafluoroethane ($C_2F_6$) and mixtures can be used. Some compound semiconductors such as silicon-germanium (SiGe) are etchable by these fluorocarbons, however, and accordingly are less preferred for use in making the active collector, base and emitter layers of the HBT 100. In an alternative embodiment, steps 230 and 235 are carried out at a later point in the process 200, such as, for example, after fabrication of the base electrode 135 is completed in step 270.

In step 240, the emitter layer 124 is selectively dry etched as shown in cross section in FIG. 4 to form the emitter 125 also shown in cross section in FIG. 1. Wet etching as carried out for example using an aqueous mixture of HCl and $H_3PO_4$, has typically been conventionally used for such etching in order to sufficiently undercut the emitter layer structure so that the base electrode can then be deposited without resulting in shorting. However, this undercutting also reduces the surface area of contact between the emitter and the emitter electrode, degrading the transistor performance. Moreover, where small device dimensions are desired, wet etching of the emitter layer can result in its structural weakness or even its complete dissolution by the etchant. Wet etching typically removes at least about 0.2 micron (µm) from the perimeter of the emitter layer. Hence, wet etching typically imposes a minimum emitter perimeter size limit of about 1 square µm on transistor design, because a smaller emitter is likely to be disintegrated by the wet etching process. Undercutting also contributes to the needed distance between an emitter and a base electrode in an HBT for a given performance specification. This distance contributes increased parasitic base access resistance in the HBT because current has to travel farther between the base electrode and the emitter. The parasitic base access resistance, in turn, contributes to decreasing the HBT performance, as measured by the maximum oscillation frequency, for example. In addition to the above discussed issues regarding the distance between the base electrode and the emitter layer, subsequent placement of a base electrode may also lead to shorting with the emitter electrode, as the sandwich layers are too thin to prevent such a failure.

Accordingly, a dry etchant is employed that is suitable for dissolving Group II, III, IV and V semiconductors but which leaves the emitter electrode 130 substantially intact. For example, a chlorine based etchant composition comprising chlorine ($Cl_2$) or boron trichloride ($BCl_3$), another halide etchant such as hydrogen bromide (HBr) or hydrogen iodide (HI) to which the emitter electrode metals are generally resistant, can be used. Alternatively, a hydrocarbon etchant such as methane (CH4) or a higher hydrocarbon, mixed with hydrogen, can be used. Hydrogen may however be undesirable in some instances, such as in the presence of a carbon-doped P-type compound semiconductor such as InGaAs, which hydrogen tends to passivate. Dry etchants typically also comprise an inert gas such as argon, helium, nitrogen or xenon. Inert gases are included to provide a physical sputtering component to the etching process, and to preferentially slow down or accelerate chemical reactions induced by other dry etchant ingredients. For example, the rate of etching of indium can thus be accelerated relative to the rate of etching of phosphorus.

Step 240 is carried out using a dry etchant so that undercutting of the resulting emitter 125 is substantially minimized. The term "dry" in this context means that the etching process is carried out in a vacuum chamber, where the etchant gas is excited in a plasma by an external radio frequency source, such processes being commonly known as reactive ion etching (RIE). Other forms of dry etching processes include inductively coupled plasma reactive ion etching (ICP—RIE), electron cyclotron resonance plasma etching, or a combination of these processes.

As shown in cross section in FIG. 4, the sides 126 and 127 of the emitter 125 are substantially vertical and straight, rather than eroded inward as shown by the dotted lines 128 and 129. The compositions for fabricating the emitter electrode 130 as discussed earlier contribute to the resistance of the emitter electrode 130, and the portion of the emitter 125 underlying the emitter electrode 130, to erosion by the etching process. These sides 126 and 127 define the emitter electrode 130 as a semiconductor substructure of predefined horizontal dimensions with respect to the HBT 100. Desirably, this minimization of undercutting facilitates the formation of emitters 125 having very small dimensions. For example, emitters 125 having lengths and widths or diameters in a range between about 0.5 µm and about 0.25 µm can be formed. Furthermore, emitters 125 having lengths and widths or diameters in a range of about 0.25 µm can be formed. In an alternative embodiment in which the substrate 105, emitter 125, base 120, collector 115, and subcollector 110 form a sandwich in the listed order with the substrate 105 on the bottom, the subcollector 110, collector 115 and collector electrode 140 are etched in an analogous manner to that discussed in steps 235 and 240, respectively.

In step 245, a diffusion inhibition layer is applied to the exposed surface 122 of the base layer 121. This diffusion inhibition layer reduces and controls subsequent potential migration of the base electrode 135 into the base 120. For example, tungsten silicide or tungsten-titanium-silicide can be used. In another embodiment, a thin interlayer of a material for improved conductivity can be formed on the exposed surface 122, followed by formation of an antidiffusion layer on the interlayer. For example, a thin layer of titanium, palladium, chromium, nickel or an alloy of same can be used to form the interlayer. Further for example, a thin layer of tungsten, platinum or an alloy of same can be used to form the antidiffusion layer. The diffusion inhibition layer or the interlayer and antidiffusion layer can as desired be formed either before or after formation of the spacer ring 145. Such layer or layers can be applied, for example, by electroplating, evaporation, casting, electroless deposition or sputtering. In another embodiment, step 245 is omitted.

Figure 5:
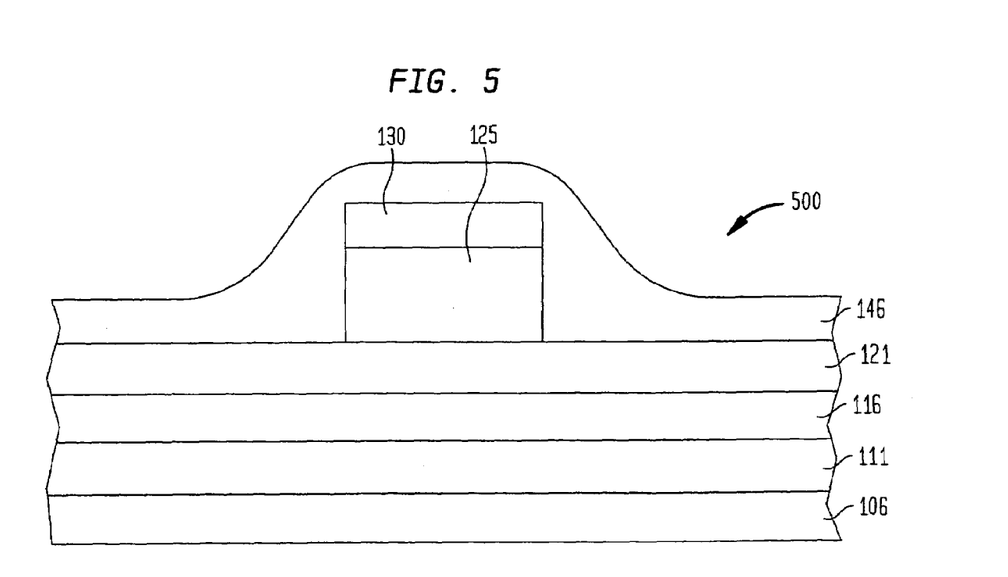

In step 250, a spacer ring layer 146 is formed as shown in the cross section 500 of HBT 100 in FIG. 5 on the base layer 121 and the emitter electrode 130, and laterally adjacent to the emitter 125. Desirably, the spacer ring layer 146 is deposited over the exposed surfaces of such elements to a substantially uniform thickness. As discussed earlier, in one embodiment the spacer ring 145 is formed of an insulating composition such as $Si_3N_4$. In one embodiment, $Si_3N_4$ is deposited in the vapor phase using PECVD, yielding a substantially uniform $Si_3N_4$ coating thickness over the exposed surfaces. In another embodiment, $Si_3N_4$ is deposited by sputtering. In a further embodiment, the spacer ring layer 146 is formed from a composition comprising $SiO_2$ and is applied for example by electron beam evaporation. Electron beam evaporation is generally not effective with nitrides, however. Spin coating is generally ineffective for carrying out this step, since a conformal coating, as opposed to a planarizing coating, is desired.

Figure 6:
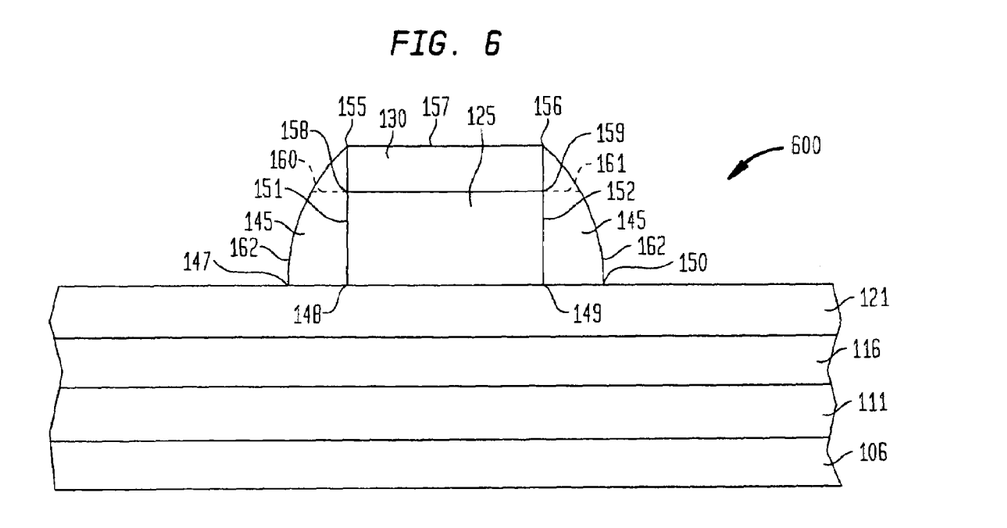

In step 255, the spacer ring layer 146 is selectively etched to form the spacer ring 145 as shown in the cross section 600 of HBT 100 in FIG. 6. In one embodiment where the spacer ring layer 146 comprises $Si_3N_4$, a low molecular weight dry fluorocarbon etchant such as $CF_4$, $CHF_3$ or $C_2F_6$ is used. In one embodiment, an ICP—RIE process is used to carry out reactive ion etching with an inductively coupled plasma. As shown in FIG. 6, the spacer ring 145 abuts the base layer 121 between points 147 and 148 and between points 149 and 150. Further as shown in FIG. 6, the spacer ring 145 abuts the emitter 125 and the emitter electrode 130 along edges 151 and 152. In subsequent formation of the base electrode 135 as discussed below, the spacer ring 145 substantially prevents the base electrode 135 from approaching the emitter 125 more closely, at junction two, than points 147 and 150. This closest approach of the base electrode 135 to the emitter 125 at junction two needs to be sufficiently large to prevent shorting. However, this closest approach desirably is as small as possible to provide a short path length for charge carriers between the base electrode 135 and the emitter 125. Desirably, the distance between points 147 and 148 and the distance between points 149 and 150 is accordingly preselected and controlled. The side surface 162 of the spacer ring 145 rises to the points 155 and 156 where the spacer ring abuts the top surface 157 of the emitter electrode 130. At intermediate points 158 and 159 defining the third junction between the emitter 125 and the emitter electrode 130, the horizontal dimensions 160 and 161 of the spacer ring 145 are smaller than are the horizontal dimensions between points 147 and 148 and between points 149 and 150, at the second junction between the base 120 and the emitter 125. In one embodiment in accordance with the present invention, each of such distances between the base electrode 135 and the emitter 125 are within a range between about 200 Å and about 1000 Å. In another embodiment in accordance with the present invention, each of such distances between the base electrode 135 and the emitter 125 are within a range between about 800 Å and about 1000 Å. These teachings potentially can be extended to such distances of less than about 200 Å as well. In one embodiment in which the spacer ring layer 146 is formed from a highly insulating dielectric composition, the spacer ring 145 can be left in place after formation of the base electrode 135 as discussed below. In this manner, the spacer ring 145 augments the insulative function provided by the separation distances between the base electrode 135 and the emitter 125 in the prevention of shorting. Hence, such separation distances can be relatively reduced, which further reduces the path length for charge carriers between the base electrode 135 and the emitter 125.

Figure 7:
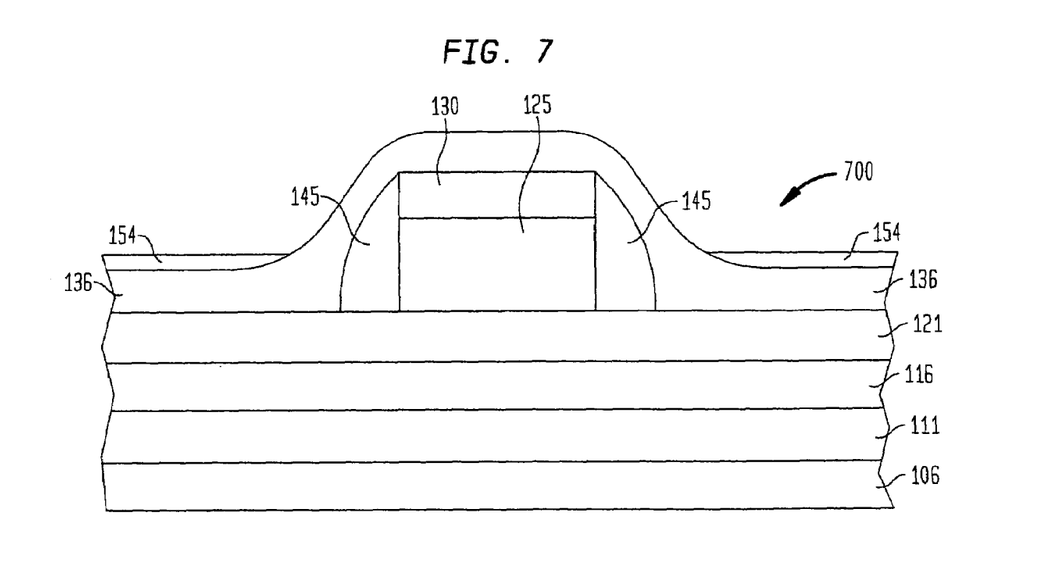

In step 260, a base electrode precursor layer 136 is formed as shown in the cross section 700 of HBT 100 in FIG. 7 over the base layer 121, the emitter electrode 130, and the spacer ring 145. Desirably, the base electrode precursor layer 136 conforms to the surfaces on which it is applied in a substantially uniform thickness. Such layer can be applied, for example, by electroplating, evaporation such as electron beam evaporation, casting, electroless deposition, metal chemical vapor deposition, or sputtering. This layer may have an average thickness of, for example, between about 200 Å and about 500 Å.

In step 265, a planarizing layer 154 as shown in FIG. 7 is applied over the portions of the base electrode precursor layer 136 intended to constitute the base electrode 135. The planarizing layer 154 is formed from a composition that is resistive to dry etchants for the base electrode precursor layer 136 as discussed in connection with step 270 below. For example, the planarizing layer may be formed from an organic spin-on coating such as a polyimide, benzo-cyclobutene, or spin-on glass.

Figure 8:
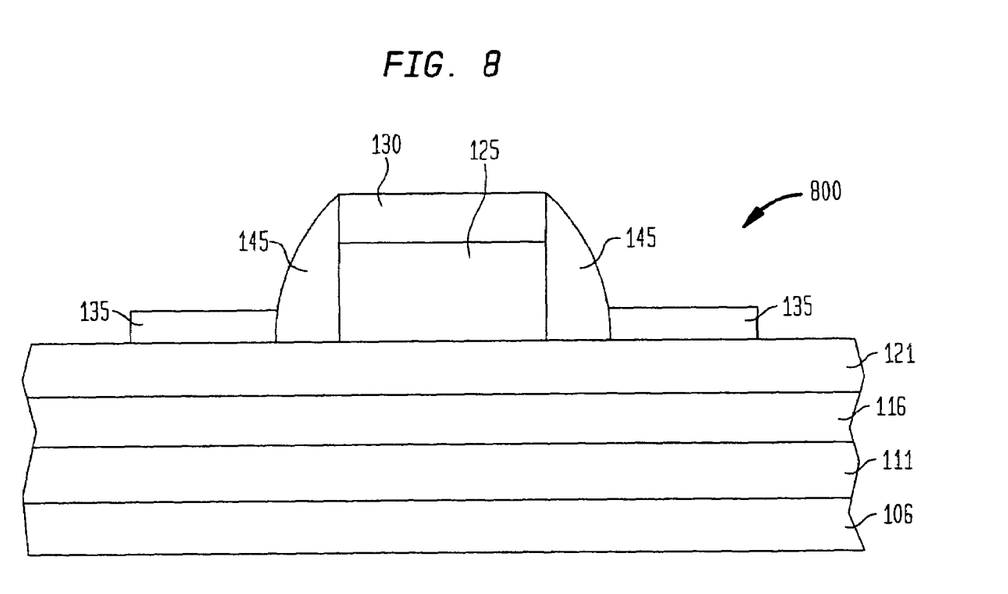

In step 270, the base electrode precursor layer 136 is selectively etched as shown in the cross section 800 of HBT 100 in FIG. 8 to form the base electrode 135. As can be seen in FIG. 8, the spacer ring 145 defines and controls the distance between the base electrode 135 and the emitter 125. Referring to FIGS. 7 and 8, this selective etching step also removes a sufficient portion of the base electrode precursor layer 136 bridging the base electrode 135 and the emitter 125 to prevent shorting. So long as a sufficient gap is formed between the emitter 125 and the base electrode 135 to prevent their direct electrical connection, removal of further portions of the base electrode precursor layer 136 is optional. The spacer ring 145 can, if formed from a highly insulating dielectric composition, further prevent direct conductive contact between the base electrode 135 and the emitter 125. In carrying out step 270, the spacer ring 145, and a suitable coating on the emitter electrode 130, protect the emitter electrode 130 and the emitter 125 from etching. For example, the emitter electrode 130 may include an oxidized top metal surface. Alternatively, the surface of the emitter electrode 130 may be temporarily covered by a suitable protective coating. In one embodiment, that portion of the base electrode precursor layer 136 covering the top surface of the emitter electrode 130 as shown in FIG. 7 is completely removed, so that the emitter electrode 130 can have a different composition or structure than does the base electrode 135. Step 270 is carried out by using a dry etchant. For example, a low molecular weight fluorocarbon such as carbon tetrafluoride ($CF_4$), trifluoromethane ($CHF_3$), hexafluoroethane ($C_2F_6$), and mixtures can be used.

In one embodiment not shown, the spacer ring 145 is then removed in step 275, for example by selective etching. The appropriate etchants depend on the chosen composition for the spacer ring 145. According to this embodiment, the spacer ring 145 is replaced by ambient air, essentially having a dielectric constant of b 1. In another embodiment, a spacer ring having a different composition is then formed to replace the spacer ring 145. For example, the spacer ring 145 formed in steps 250 and 255 could have a non-insulating composition, and the replacement spacer ring 145 could be formed from a selected highly insulating dielectric composition. In another embodiment, step 275 is omitted.

In step 280, suitable etching is carried out to expose a portion of the subcollector layer 111 for formation of the collector electrode 140 shown in FIG. 1. Alternatively, the subcollector layer 111 can be formed to cover a larger surface area over the substrate 105 than does the collector layer 116, leaving a portion of the subcollector layer 111 exposed for carrying out this step.

In step 285, the collector electrode 140 is formed, for example by electroplating, evaporation such as electron beam evaporation, casting, electroless deposition, metal chemical vapor deposition, or sputtering. This electrode may have an average thickness of, for example, between about 400 Å and about 6000 Å. In an alternative embodiment, not shown, the collector electrode 140 can be formed by a series of steps analogous to those discussed above for forming the base electrode 135. The emitter electrode 130 and emitter 125 can be suitably protected, and a portion of the base electrode 135 and of the underlying base 120 can be selectively etched to expose a portion of the collector 115. Alternatively, an underlying portion of the subcollector 110 can also be exposed. A collector electrode precursor layer can then be formed over the HBT 100 in the same manner as discussed above in connection with steps 245–275. This alternative embodiment is particularly worthwhile where the thickness of the collector 115 is reduced to approximately the same thickness as the base 120. As this relative thickness reduction occurs, the sheet resistance of the collector 115 increases to a point where reducing the conductive path length between the collector electrode 140 and the base 120 becomes important in order to yield a high performance HBT.

Further steps may then be undertaken to protect the HBT 100 from damage and deterioration, and to place it into use. For example, the HBT 100 may be covered with a dielectric passivation layer. The dielectric passivation layer is formed from a dielectric material that serves to insulate the HBT 100 from unwanted electrical contacts, to physically protect the delicate transistor from any undesired direct conductive and physical contact, and to provide a stable platform for completing integration of the HBT 100 into an external circuit. The dielectric passivation layer can be fabricated of, for example, silicon dioxide, silicon nitride, divinylsilane benzocyclobutene (BCB), or siloxene. Siloxene is a methylated Si—O polymer commonly known as spin on glass (SOG). Selective etching may also be done to expose the emitter electrode 130, the base electrode 135 and the collector electrode 140, and metal traces for interconnecting the HBT 100 with an external circuit may be provided. Except for the dry etching process, etching steps can alternatively be performed, for example, by liftoff. The HBT 100 can also be combined with other HBTs and components to form an integrated circuit device.

Further background information regarding HBT fabrication is provided in the following commonly owned patent applications, each of which is hereby incorporated by reference herein in its entirety: U.S. patent application Ser. No. 10/243,369, filed on Jul. 9, 2002 by Chen, Young-Kai; Chua, Lay-Lay; Houtsma, Vincent Etienne; Kopf, Rose Fasano; Leven, Andreas; Liu, Chun-Ting; Sung, Wei-Jer; and Yang, Yang, entitled "Bipolar Transistors with Vertical Structures"; U.S. patent application Ser. No. 10/624,038, filed on Jul. 21, 2003 by Chen, Young-Kai; Kopf, Rose Fasano; Sung, Wei-Jer; and Weimann, Nils Guenter, entitled "Flat Profile Structures for Bipolar Transistors"; and U.S. patent application Ser. No. 10/430,499, filed on May 6, 2003 by Chua, Lay-Lay; Liu, Chun-Ting; and Yang, Yang, entitled "Using Metal Features to Align Etches of Compound Semiconductors".

The HBT transistors made in accordance with the teachings herein can generally be used in any end use applications suitable for HBT transistors. In view of the reduced scale of these transistors and their short preventing features, the HBT transistors are characterized by high speed performance and high reliability. The base layer sheet resistance of InP/InGaAs/InP HBT transistors made according to the teachings herein is, for example, within a range of about 400 $\Omega$/sq and about 1000 $\Omega$/sq. A cutoff frequency $f_t$ of 200–400 GHz may be obtained, and an $f_{max}$ of 200–500 GHz may be obtained with appropriate scaling of the base-collector capacitance. For example, HBT devices with spacers have been realized yielding $f_t$ up to 290 GHz and $f_{max}$ up to 200 GHz.

While the present invention has been disclosed in the context of various aspects of presently preferred embodiments, it will be recognized that the invention may be suitably applied to other environments consistent with the claims which follow. Other types of active devices can also be fabricated according to the teachings of the invention. The process of FIG. 2 as discussed in connection with FIGS. 3–8 can be modified in accordance with the spirit of the present invention. The process steps can be carried out in different ordered sequences consistent with the teachings herein. Active device fabrication procedures are extremely complex, and the method steps according to the present invention can be adapted consistent with efficient execution of such active device fabrications.

While the present invention has been disclosed in the context of various aspects of presently preferred embodiments, it will be recognized that the invention may be suitably applied to other environments consistent with the claims which follow.

We claim:

1. An apparatus comprising:
a first layer including a compound semiconductor composition doped to have a first charge carrier polarity;
a second layer including a compound semiconductor composition doped to have a second charge carrier polarity and located on said first layer;
a third layer including an indium phosphide compound semiconductor composition doped to have said first charge carrier polarity and located on said second layer;
a base electrode on said second layer;
a fourth layer including an indium gallium arsenide compound semiconductor composition, located on said third compound semiconductor composition layer; and
a spacer ring interposed between and defining a charge carrier access path distance between said base electrode and said third layer, said path distance being within a range of between about 200 Å and about 1000 Å.

2. The apparatus of claim 1 in which said base electrode has a distance within a range of between about 800 Å and about 1000 Å from said third layer.

3. The apparatus of claim 1 in which said base electrode comprises a contact layer on said second layer, a diffusion blocking layer on said contact layer, and a circuit interconnection layer on said diffusion blocking layer.

4. The apparatus of claim 1 in which said base electrode comprises a member selected from the group consisting of tungsten silicide, tungsten and titanium tungsten silicide.

5. The apparatus of claim 1 in which said spacer ring includes an insulating composition that comprises a member selected from the group consisting of silicon nitride, silicon dioxide, and silicon oxycarbide.

6. The apparatus of claim 3 in which said diffusion blocking layer comprises a member selected from the group consisting of tungsten silicide, tungsten and titanium tungsten silicide.

7. The apparatus of claim 3 in which said diffusion blocking layer has a thickness within a range of between about 100 Å and about 300 Å.

8. A method for fabricating a heterobipolar transistor, comprising the steps of: providing a multilayer structure comprising a first layer including a compound semiconductor composition doped to have a first charge carrier polarity, a second layer including a compound semiconductor composition doped to have a second charge carrier polarity and forming a first junction with said first layer, and a third layer including an indium phosphide compound semiconductor composition doped to have said first charge carrier polarity and forming a second junction with said second layer;
dry etching a first portion of said third layer to yield a compound semiconductor substructure, a second portion of said third layer forming a first surface of preselected horizontal dimensions and being protected from said dry etching;
surrounding said first surface of said compound semiconductor substructure with a spacer ring having a second surface of preselected horizontal dimensions;
forming a base electrode precursor on said second layer and in contact with said second surface; and
etching said base electrode precursor with a dry etchant to yield a base electrode.

9. The method of claim 8 in which an emitter electrode is formed at a third junction on said third layer prior to the step of etching said third layer.

10. The method of claim 8 in which said base electrode has a distance within a range of between about 200 Å and about 1000 Å from said third layer.

11. The method of claim 8 in which said step of forming a base electrode precursor comprises the steps of:
forming a contact layer on said second layer;
forming a diffusion blocking layer on said contact layer; and
forming a circuit interconnection layer on said diffusion blocking layer.

12. The method of claim 8 in which said step of forming a base electrode precursor comprises forming a layer comprising a member selected from the group consisting of tungsten silicide, tungsten and titanium tungsten silicide.

13. The method of claim 9 in which a preselected horizontal dimension of said spacer ring nearest to said second junction is larger than a preselected horizontal dimension of said spacer ring nearest to said third junction.

14. The method of claim 9 in which said spacer ring includes an insulating composition that comprises a member selected from the group consisting of silicon nitride, silicon dioxide, and silicon oxycarbide.

15. The method of claim 10 in which said base electrode has a distance within a range of between about 800 Å and about 1000 Å from said third layer.

16. The method of claim 11 in which said diffusion blocking layer comprises a member selected from the group consisting of tungsten silicide, tungsten and titanium tungsten silicide.

17. The apparatus of claim 1 in which said second layer includes an indium gallium arsenide compound semiconductor composition.

18. The method of claim 8 in which said second layer includes an indium gallium arsenide compound semiconductor composition.

19. The method of claim 8 comprising the step of providing a fourth layer including an indium gallium arsenide compound semiconductor composition, on said third compound semiconductor composition layer.

* * * * *